(12) United States Patent
Miles

(10) Patent No.: US 11,919,227 B2
(45) Date of Patent: Mar. 5, 2024

(54) CIRCUIT BOARD AND COMPONENT FABRICATION APPARATUS

(71) Applicant: DST Innovations Limited, Bridgend (GB)

(72) Inventor: Anthony Miles, South Glamorgan (GB)

(73) Assignee: DST INNOVATIONS, LTD., Bridgend (GB)

( * ) Notice: Subject to any disclaimer, the term of this patent is extended or adjusted under 35 U.S.C. 154(b) by 591 days.

(21) Appl. No.: 15/575,071

(22) PCT Filed: May 19, 2016

(86) PCT No.: PCT/GB2016/051445
§ 371 (c)(1),
(2) Date: Nov. 17, 2017

(87) PCT Pub. No.: WO2016/185215
PCT Pub. Date: Nov. 24, 2016

(65) Prior Publication Data
US 2018/0154573 A1 Jun. 7, 2018

(30) Foreign Application Priority Data

May 19, 2015 (GB) .................................... 1508585

(51) Int. Cl.
*B29C 64/209* (2017.01)
*B29C 64/118* (2017.01)
(Continued)

(52) U.S. Cl.
CPC .......... *B29C 64/118* (2017.08); *B29C 64/209* (2017.08); *B29C 64/393* (2017.08); *B33Y 10/00* (2014.12); *B33Y 30/00* (2014.12); *B33Y 50/02* (2014.12); *B33Y 80/00* (2014.12); *H05K 3/1241* (2013.01); *H05K 3/1283* (2013.01); *H05K 3/4664* (2013.01); *H05K 3/4682* (2013.01);
(Continued)

(58) Field of Classification Search
CPC ... B29C 64/209; B29C 64/321; B29C 64/336; B29C 64/343
See application file for complete search history.

(56) References Cited

U.S. PATENT DOCUMENTS

| 6,401,001 B1 | 6/2002 | Jang et al. |
| 2002/0051853 A1 | 5/2002 | Keicher et al. |

(Continued)

FOREIGN PATENT DOCUMENTS

| EP | 1080889 A2 | 3/2001 |
| IN | 103817942 A | 5/2014 |

(Continued)

OTHER PUBLICATIONS

International Search Report of the International Searching Authority dated Sep. 13, 2016, issued in connection with International Application No. PCT/GB2016/051445 (3 pages).

(Continued)

*Primary Examiner* — Alison L Hindenlang
*Assistant Examiner* — Alexander A Wang
(74) *Attorney, Agent, or Firm* — McCarter & English, LLP

(57) ABSTRACT

A circuit board and component fabrication apparatus comprises a print head configured to deposit one or more materials on a substrate so as to print electronic circuit boards and/or components.

15 Claims, 12 Drawing Sheets

(51) Int. Cl.
| | |
|---|---|
| B29C 64/393 | (2017.01) |
| B33Y 10/00 | (2015.01) |
| B33Y 30/00 | (2015.01) |
| B33Y 50/02 | (2015.01) |
| B33Y 80/00 | (2015.01) |
| H05K 3/12 | (2006.01) |
| H05K 3/46 | (2006.01) |
| B29L 31/34 | (2006.01) |
| H01G 4/33 | (2006.01) |

(52) U.S. Cl.
CPC ........ *B29L 2031/3425* (2013.01); *H01G 4/33* (2013.01); *H05K 2203/0126* (2013.01); *H05K 2203/013* (2013.01); *H05K 2203/074* (2013.01); *H05K 2203/107* (2013.01); *H05K 2203/163* (2013.01)

(56) References Cited

U.S. PATENT DOCUMENTS

| | | | |
|---|---|---|---|
| 2004/0140549 A1 | 7/2004 | Miyagawa | |
| 2007/0179656 A1* | 8/2007 | Eshed | B29C 64/135 700/119 |
| 2013/0170171 A1 | 7/2013 | Wicker et al. | |
| 2013/0193619 A1 | 8/2013 | Church et al. | |
| 2013/0344232 A1 | 12/2013 | Chopra et al. | |
| 2014/0061974 A1* | 3/2014 | Tyler | B33Y 80/00 264/401 |
| 2014/0328963 A1* | 11/2014 | Mark | B29C 64/209 425/143 |
| 2015/0035186 A1 | 2/2015 | Teken et al. | |
| 2015/0064047 A1 | 3/2015 | Hyde et al. | |
| 2015/0077215 A1 | 3/2015 | Ranky et al. | |

FOREIGN PATENT DOCUMENTS

| | | |
|---|---|---|
| WO | 99/19900 A2 | 4/1999 |
| WO | 02/01929 A2 | 1/2002 |
| WO | 2008/102266 A2 | 8/2008 |
| WO | 2011/006641 A1 | 1/2011 |

OTHER PUBLICATIONS

Written Opinion of the International Searching Authority dated Sep. 13, 2016, issued in connection with International Application No. PCT/GB2016/051445 (8 pages).
"Voltera 3D Prototyping Printer," Neeraj Tewari, Nov. 10, 2014, <http://neerajtewariit.com/tag/3d-printing> (4 pages).
"Voltera's circuit board printer wants to be the 'Makerbot of electronics'," VentureBeat, Nov. 7, 2014, <https://venturebeat.com/2014/11/07/volteras-circuit-board-printer-wants-to-be-the-makerbot-of-electronics> (3 pages).
"Tel Aviv Listed 'Nano Dimension' developing 3D printer & Nano inks for printing electronics at home," www.3Ders.org, Oct. 3, 2014, <https://www.3ders.org/articles/20141003-tel-aviv-listed-nano-dimension-developing-3d-printer-printing-electronics.html> (7 pages).
"Voxel8 announces first new electronics 3D printer, now available for pre-order," www.3Ders.org, Jan. 5, 2015, <http://www.3ders.org/articles/20150105-voxel8-announces-first-new-electronics-3d-printer-now-available-for-pre-order.html> (9 pages).
"Argentum—Make Electronics in Minutes," Cartesian Co., archived website on Mar. 28, 2015, <https://web.archive.org/web/20150328041143/https://www.cartesianco.com/pages/argentum> (6 pages).
"Introducing the DragonFly 2020 Revolutionary 3D Printer for Professional PCB Electronics," Nano Dimension, archived website on Oct. 16, 2015, <https://web.archive.org/web/20151016012330/http://www.nano-di.com/3d-printer> (12 pages).
"Optomec to Showcase Advances in 3D Printed Electronics," Nanowerk News, May 21, 2014, <https://www.nanowerk.com/nanotechnology-news/newsid=35686.php> (3 pages).
"Advanced Manufacturing Technologies for 3D Printed Electronics," Neotech AMT GmbH, archived webpages on Jan. 23, 2015, <https://web.archive.org/web/20150123065759/http://www.neotech-amt.com/> and <https://web.archive.org/web/20150123065805/http://www.neotech-amt.com/3d-printed-electronics-technology/> (3 pages).
"3D Printed Electronics—'Manufacturing Systems' and 'Applications'," Neotech AMT GmbH, archived webpages on Jan. 24, 2015, <https://web.archive.org/web/20150124193918/http://www.neotech-amt.com/3d-printed-electronics-manufacturing-systems/> and <https://web.archive.org/web/20150124072012/http://www.neotech-amt.com/3d-printed-electronics-applications/> (4 pages).
"Aerosol Jet Technology for 3D Printed Electronics," Optomec, 2017 website <https://www.optomec.com/printed-electronics/aerosol-jet-technology/> (7 pages).
"Aerosol Jet Technology," Optomec, archived webpage on Feb. 3, 2016, <https://web.archive.org/web/20160203221320/http://www.optomec.com/printed-electronics/aerosol-jet-technology> (4 pages).
"Frequently Asked Questions—Voxel8 3D Electronics Printing," Voxel8, archived webpage on Apr. 19, 2015, <https://web.archive.org/web/20150419012937/www.voxel8.co/faq/> (13 pages).
"The Developer's Kit 3D Printer," Voxel8, archived webpage on Oct. 3, 2016, <https://web.archive.org/web/20161003132436/http://www.voxel8.com/printer> (9 pages).
International Preliminary Report on Patentability dated Nov. 21, 2017, issued in connection with International Application No. PCT/GB2016/051445 (9 pages).
Combined Search and Examination Report dated Jan. 25, 2016, issued in connection with UK Patent Application No. GB 1508585.5 (11 pages).
Examination Report dated Dec. 1, 2017, issued in connection with UK Patent Application No. GB 1508585.5 (6 pages).
Examination Report dated Apr. 22, 2021, issued in connection with European Patent Application No. EP 16731629.8 (4 pages).

\* cited by examiner

CIRCUIT BOARD AND COMPONENT FABRICATION APPARATUS

CROSS-REFERENCE TO RELATED APPLICATIONS

This application is a U.S. National Phase Application under 35 U.S.C. 371 of International Application No. PCT/GB2016/051445 filed May 19, 2016, which claims the benefit of priority to United Kingdom (Great Britain) Patent Application No. 1508585.5 filed May 19, 2015. The entire contents of each of the two foregoing patent applications are incorporated herein by reference.

FIELD OF THE INVENTION

This invention relates to a construction method and apparatus for printing multi-layered electronic circuits and/or components.

SUMMARY OF THE INVENTION

Aspects of the invention are defined in the accompanying claims.

Embodiments of the invention may enable the construction of multi-layered electronic circuits and components.

Embodiments of the invention include a print head apparatus that acts as a means for constructing the multi-layered electronic circuit and components.

Embodiments of the invention include a system to construct the structural elements of a device or component at the same time as it constructs the electronic circuit board and/or components.

Embodiments of the invention include the print head apparatus including an optical positioning sensor to enable precision construction of the electronic circuit and components.

Embodiments of the invention include means to vibrate, heat and/or cool the substrate of the electronic circuit.

Embodiments of the invention include methods of construction of multi-layered electronic circuits and components using a standalone fabrication unit.

Embodiments of the invention include means for activating a gas removal and air filtration system within the standalone fabrication unit.

Embodiments of the invention may enable the rapid fabrication of electronic components containing a liquid.

A further embodiment of the invention includes an apparatus for the 3-dimensional printing of colour changing components, that enables the colour of the structure to be changed during the fabrication process.

BRIEF DESCRIPTION OF THE DRAWINGS

There now follows, by way of example only, a detailed description of embodiments of the present invention, with reference to the figures identified below.

DETAILED DESCRIPTION OF EMBODIMENTS OF THE INVENTION

Printing Multi-Layered Electronic Circuits and Components

The following description relates to construction systems designed to automatically print multi-layered electronic circuits and some or all of the electronic components that would normally be added using techniques such as manual or automated pick and place, hand placing, manually soldering or other such methods known in the art.

Electronic components can be directly fabricated at the same time as fabricating the circuit board using the methods described herein. The construction process may enable the fabrication of one or more of transistors, resistors, capacitors, light emitting capacitors, inductors, diodes, light emitting diodes, switches, connectors and contacts, integrated circuit, and other forms of electronic units needed to construct a complete electronic device, or a component part of an electronic device.

The fabrication apparatus disclosed in this application may also enable the printing of the substrate, and/or structural elements of the protective casing of a device or component, at the same time as it prints the electronic circuit board and other any electronic components. The structural elements may include a protective casing, supports, holes, location marks, mountings, or any other means for the inclusion of electronic components or non-electronic components that need to be added manually or by an automated location system, or pick and place that may or may not be included as part of the integrated functions of the system.

In the event that an electronic component may not be printed as part of the fabrication system described herein, components may be placed manually by stopping the system and inserting them, and then starting the system again to continue the rest of the fabrication, or by way of a pick and place instruction set and head nozzle, for example designed with a suction pad and/or using an optical placement system as described herein. The components that use the pick and place method may be secured using an electrically suitable adhesive that may be cured using any one of the curing systems described herein.

Print Head

Figure 1:
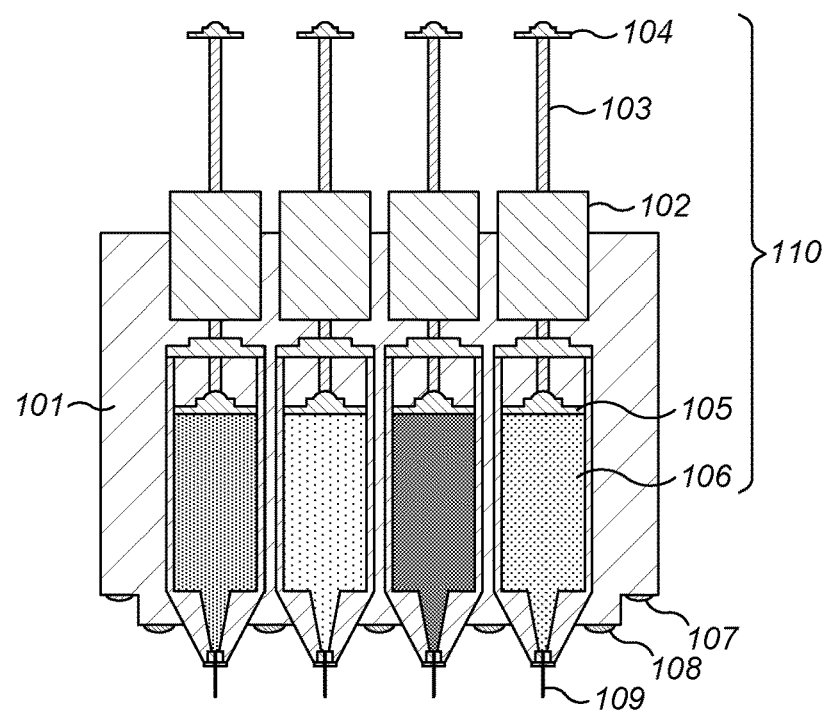
FIG. 1 is a schematic representation of the print head.

FIG. 1 is a schematic representation of a print head used to print and fabricate an electronic circuit board and components. The print head comprises the following features: an electronic logic system and X,Y drive system 101, pressure control units and drive units 102, pressure extension arm 103, a pressure extension arm stop and empty sensor 104, a piston for the material pressure cylinder 105, a pressure cylinder 106, an optical positioning and print inspection sensor 107, a material curing energy source 108, a height sensing, precision material dispensing nozzle 109 and a dispenser 110.

A process and system for construction of the electronic circuit board and component using the print head will now be described.

The main body of the print head mechanism includes some or all of the electronics needed to control the units for dispensing and curing the materials to be deposited and location sensors for the drive system to control its X, Y and Z location. The main body of the print head also holds the dispenser 110 that stores and deposits the material onto the substrate. The dispenser comprises the removable pressure control units and drive 102, the pressure extension arm 103, the pressure extension arm stop and empty sensor 104, the material pressure cylinder 105 and the pressure cylinder 106. The removable pressure control units and drive 102 control the amount of pressure that is put on the pressure extension arm 103. The pressure control units and drive 102 may use one or more means to apply the required force to the pressure extension arm 103; this may include a screw mechanism, a stepper motor drive assembly, a piezoelectric motor, a hydraulic mechanism, air pressure, or other methods known in the art.

The pressure extension arm stop and empty sensor 104 provide an absolute stop for the pressure extension arm 103 and a proximity sensor that indicates the volume of material in the dispenser and the rate at which it is being dispensed. This ensures precise control over the rate of material flow. The piston for the material pressure cylinder 105 provides a sensor controlled pressure on the material in the pressure cylinder 106 which contains the material being used in the construction of the electronic circuit and components. The sensor in the piston for the material pressure cylinder 105 continually feeds back information to the print head control system, to adjust the flow of material to the height sensing, precision material dispensing nozzle 109.

The pressure cylinder 106 is a pressurized container that is designed not to expand and contract to any appreciable degree as the piston for the material pressure cylinder 105 adjusts for optimum material flow during the dispensing of the material. The material contained within the pressure cylinder 106 can be automatically replenished using a continual feed controlled by a pressure valve and digital or analogue sensor.

The optical positioning and print inspection sensor 107 includes an optical sensor that is designed to read high precision print registration marks that are laid down at the beginning of the print job onto the build platform and/or on the print job itself. This sensor is also used to inspect specified areas of the print job during construction. This action will help to ensure that functionally critical sections of the print are of sufficient quality, specifically for items that are in the very small e.g. micron or nanometre size range. The optical positioning and print inspection sensor 107 operates by recognizing lines and marks that have been included, by the user, as part of the print area. The system is not limited to this method and may include the ability to read optical codes such as QR style codes.

The material curing energy source 108 may comprise a plurality of light and heat sources, placed on the print head so as to cure the material as it is being laid down in the fabrication process. The material curing energy source 108 can be made up of IR, UV, or other frequency of light emitting diodes, directed heating elements including hot air, radio frequency, sonic directed frequency and/or any other curing methods known in the art.

The height sensing, precision material dispensing nozzle 109 is a nozzle system that can adjust its height so that the nozzle 109 cannot damage the printed material as it is being laid down. The nozzles are moved up and down to provide clearance above the substrate as the print head is moved rapidly around the print area. The nozzles 109 are also used to define the height of layers to be printed, ensuring that the correct amount of material is laid down. This is achieved by moving the dispensing nozzle 109 into position and lowering it to define the height of the material after curing. In the event that the material is not of the required thickness, more material can be added or the height of the dispensing nozzle can be adjusted for the next layer. This is specifically useful with a material that will change its volume during curing.

The operation of the print head may be controlled by a design application (e.g. a software application) that enables the inputting of 3-dimensional drawing data that configure the movement of the print head and how it deposits material. The input data represents the circuit and component designs the user wishes to fabricate.

Feedback from the optical positioning and print inspection sensors 107 may be delivered to the software application, which enables the print head to alter its velocity as it moves across the substrate. This interaction between the optical positioning and print inspector sensors 107 and the software application helps the print head determine, both optically and dimensionally, whether the print fabrication is being undertaken correctly.

Print and Curing Processes

Figure 2:
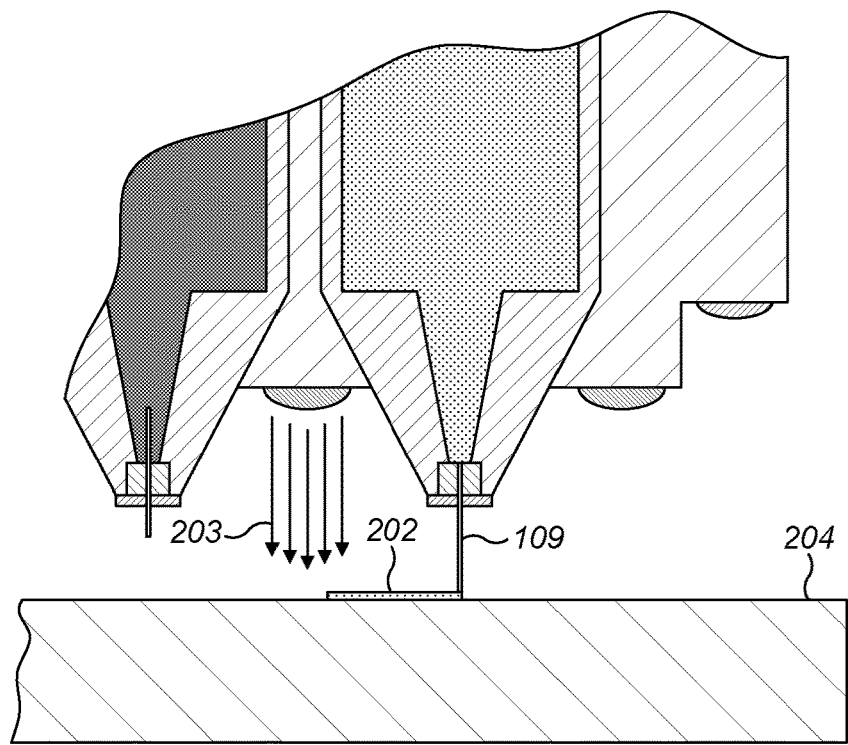
FIG. 2 is a schematic representation of the print and curing process used in an embodiment.
Figure 3:
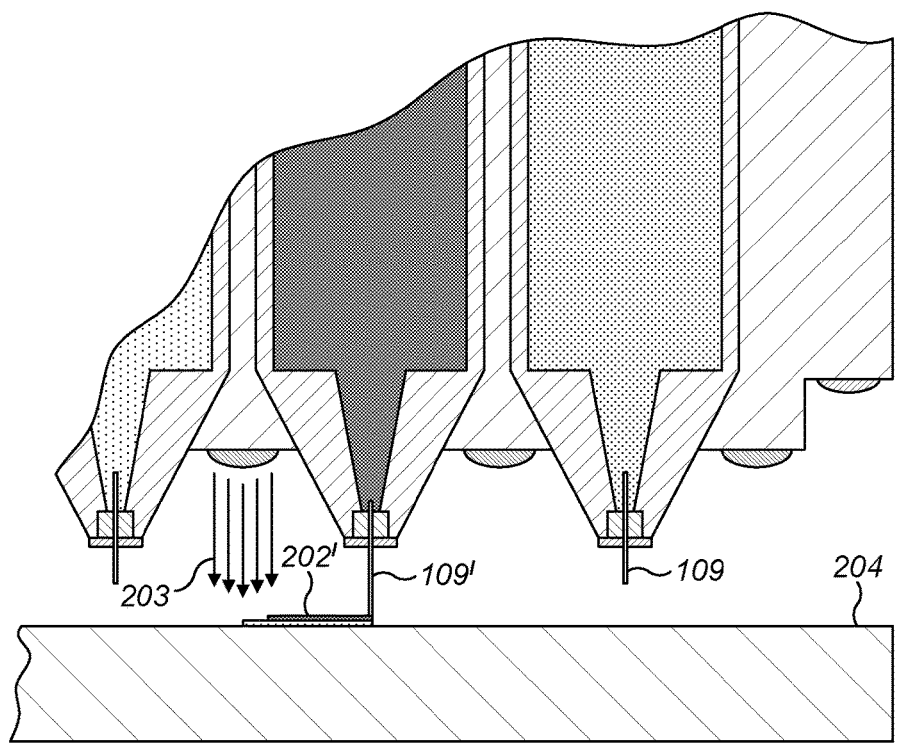
FIG. 3 is a schematic representation of the print head apparatus as it constructs the multi-layered electronic circuit and components.

FIGS. 2 and 3 are schematic representations of the processes undertaken by the print head, of an embodiment similar to that of FIG. 1, to print and cure the material as it is deposited on a substrate. FIG. 2 illustrates a print head, as described by FIG. 1, further incorporating a retractable nozzle to dispense the material. FIG. 2 comprises a retractable nozzle 109, the material 202 being dispensed by the nozzle 109, an energy source 203 used to cure the material being dispensed, and the platform or substrate 204 that the material 202 is being dispensed upon. FIG. 3 represents the next stage of the printing and curing process, wherein an additional nozzle 109' dispenses another layer of material 202' onto the substrate 204.

The retractable nozzle 109 is lowered to the required height for the desired level of material to be dispensed and then the print head is moved as material is forced through the nozzle 109, therefore printing the desired circuit configuration. The speed of the print head movement is dependent on the type of material to be dispensed. These parameters are set by the design for the electronic circuit, through the software application.

The material dispensed by the nozzle 109 may be printed onto the build platform, a preloaded substrate, or a pre-printed material that is present on the build platform prior to the build platform being loaded. The material being dispensed by the nozzle 109 is then cured by a source of energy 203. This source of energy is as described in FIG. 1. The build platform 204 that the material is being dispensed on to is a level platform designed to provide a stable print bed for the construction of the printed unit. The build platform 204 may be heated and cooled depending on the material being printed. The build platform 204 may be vibrated to ensure the correct distribution of some materials that are being printed.

The first retractable nozzle 109 is then retracted and the second retractable nozzle 109' is then extended. The order of retraction and extension of the nozzles will depend on the material to be printed. The next layer of material to be dispensed by the next nozzle 109' is then dispensed over of the material dispensed by the retractable nozzle 109. The print head is moved as material is forced through the nozzle. The speed of the print head movement is dependent on the type of material to be dispensed. The build platform 204 height is then adjusted to account for the new layer position.

One of the advantages of the retractable and height sensor nozzle 109, 109' is that in the case of printed electronic components, not all of the material will be laid down at the same height. As different materials cross other materials that have already been laid down, the height of the material will dynamically change.

The source of energy 203 used to cure the material dispensed is then energized to cure the second material 202'. The build platform 204 is adjusted along with the position of the print head and the material 202' and the retractable nozzle 109'.

Print Head Layout

Figure 4:
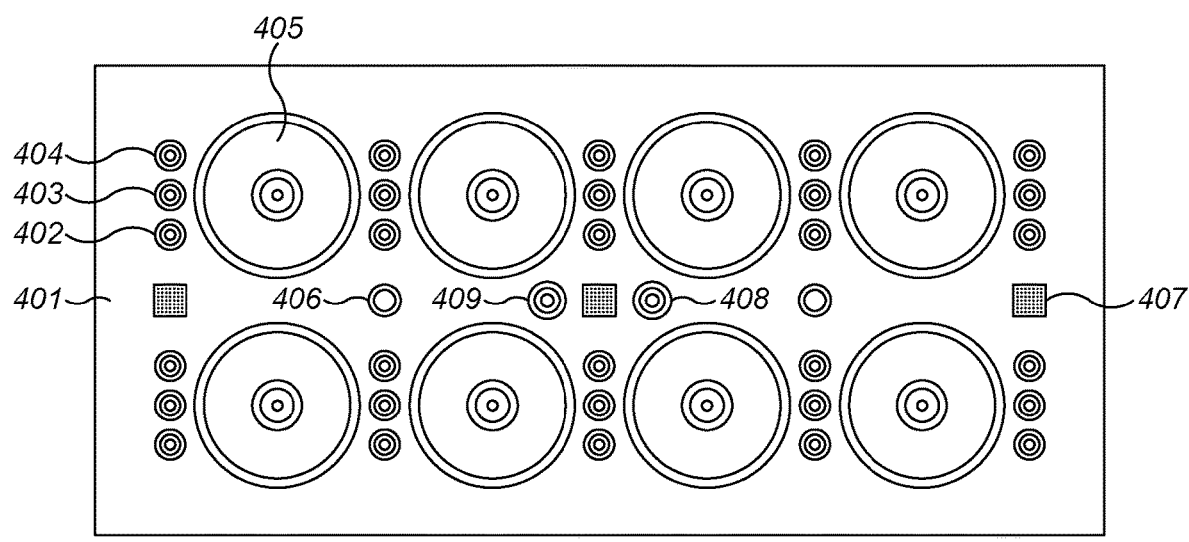
FIG. 4 is a schematic cross-sectional diagram of the print head layout.

FIG. 4 is a schematic cross sectional diagram illustrating the print head apparatus, as described with reference to FIGS. 1, 2 and 3, used to print the electronic circuit boards and components. FIG. 4 illustrates a print head apparatus comprising: a casing 401 of the print head, a source of energy 402 that is used to cure the material dispensed, an alternative source of energy 403 to the first source of energy used to cure the material dispensed, a further alternative energy source 404 used to cure the material dispensed, a container for the material to be dispensed and the retractable dispenser unit 405 that dispenses the material at the correct speed, width and depth, a digital camera and automatically focused optics system 406, a pin sensor array 407 for sensing the electrical contact and/or the depth of the material dispensed, a laser diode 408 for rapid heating or ablating of material and an additional laser diode 409 of an alternative frequency.

The casing 401 of the print head is designed to be rigid and removable to enable easy maintenance. The casing not only holds the material dispensing nozzles 109, 109', a curing system, that includes a sintering system, and sensors, but also holds the positioning control electronics and optical positioning apparatus 107. The sources of energy 402, 403, 404 used to cure the material dispensed from the material container may be as described in FIGS. 1, 2, and 3, or any other source of directed energy that is known in the art.

The material container 405 is located between the sources of energy 402, 403, 404 and protects the material inside the container from being affected by the energy source before it is dispensed.

Binary Material Print Head

Figure 5:
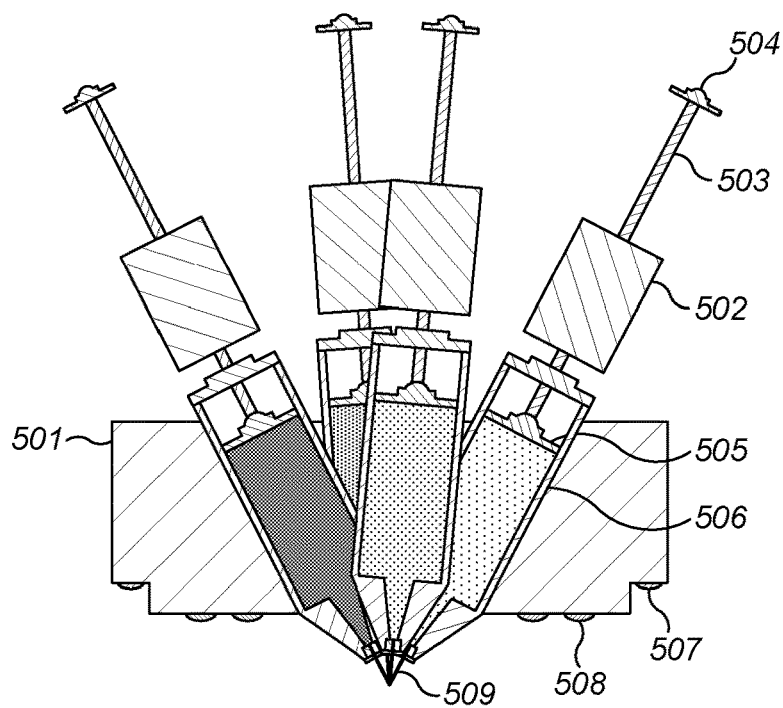
FIG. 5 is a schematic representation of a binary material print head.

FIG. 5 is a schematic illustration of a print head, similar to that disclosed in the embodiments of FIGS. 1 to 3. FIG. 5 shows a binary print head comprising: an electronic logic system and X,Y drive system 501, pressure control units 502, a pressure extension arm 503, a pressure extension arm stop and empty sensor 504, a piston for the material pressure cylinder 505, a pressure cylinder 506, an optical positioning and print inspection sensor 507, a material curing energy source 508 and a height sensing, precision material dispensing nozzle 509.

The functionality of the binary print head is the same as described in FIGS. 1, 2 and 3 with the exception of the locations of the pressure cylinders 506 and the height sensing, precision material dispensing nozzles 509. The height sensing, precision material dispensing nozzles of FIG. 5 are grouped together so that material can be dispensed from different nozzles 509 at or around substantially the same point. This allows different materials to be combined at the point of dispensing, so as to create a mixture or to react together. For example, one material may act as a hardener for another material. The materials may be mixed or reacted together in precisely controlled quantities.

Material Extruder and Milling Print Head

Figure 6:
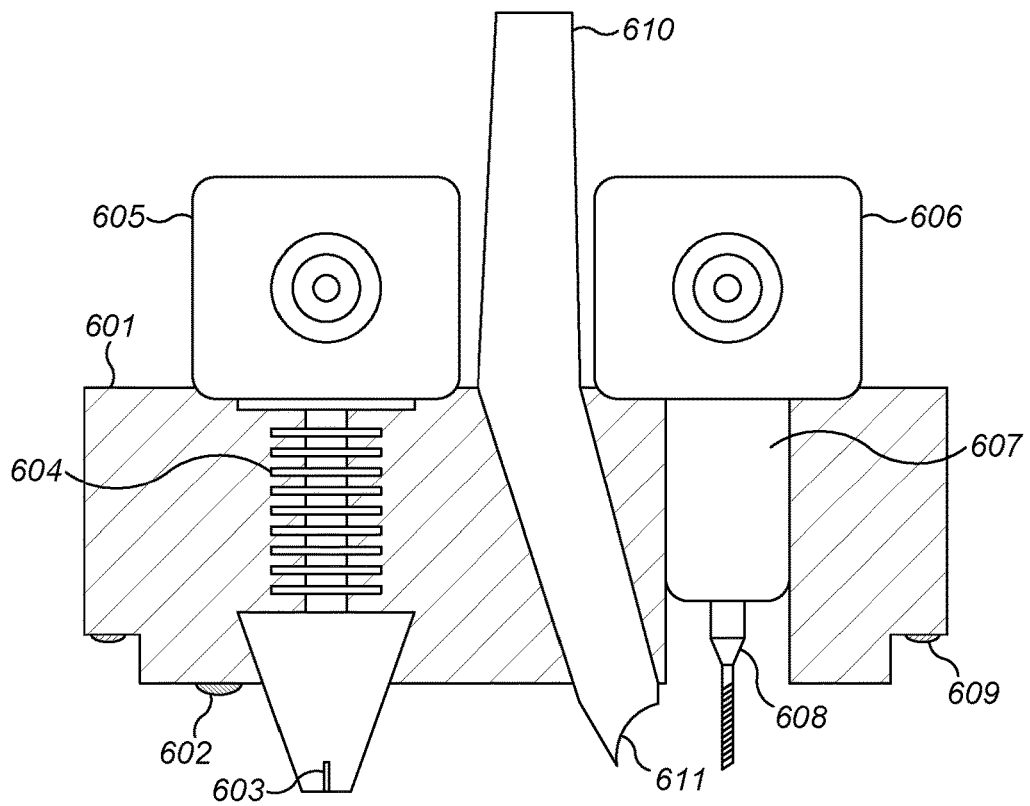
FIG. 6 is a representation of a material extruder and milling print head that can be used in conjunction with any of the preceding embodiments.

FIG. 6 is a schematic representation of a material extruder and milling print head that is capable of being used in conjunction with the print head of the preceding embodiments. FIG. 6 illustrates a material extruder and milling print head comprising: an electronic logic system and X,Y drive system 601, a material curing energy source 602, a variable size extruder nozzle 603, a heating element for the material extruder 604, a material feed and pressure sensor system 605, a digital variable drive system for the retractable milling head 606, a fast change milling tool grip that holds the tool 607, a milling tool 608, an optical positioning and print inspection sensor 609, a flexible milled material vacuum tube 610 and a vacuum nozzle for the removal of milled material 611.

The print head depicted in FIG. 6 has positioning system 601 and material curing system 602, as described in FIGS. 1, 2, and 3, so that the heads described throughout this document can be interchanged for use on a single print platform. The variable size extruder nozzle 603 is a heated extruder nozzle that can be changed to adjust the size of the material as it is being distanced.

The heating element for the material extruder 604 heats up the material as it is being pushed though the material feed and pressure sensor system 605, forcing it through the variable size extruder nozzle 603. The digital variable drive system for the retractable milling head 606 is a precisely controlled drive system that controls speed, drive resistance, and height of the milling tool 608.

The fast change milling tool grip 607, that holds the milling tool 608, is designed to enable automatic selection of milling tools by moving to a location in the system that contains one or more milling tools, or by the manual changing of the tool by hand. The optical positioning and print inspection sensor is as described in FIGS. 1, 2, and 3. The flexible milled material vacuum tube 610, and the nozzle 611 removes excess material from the part as it is being milled and deposits it in a sealed container for recycling.

Standalone Rapid Fabrication Unit

Figure 7:
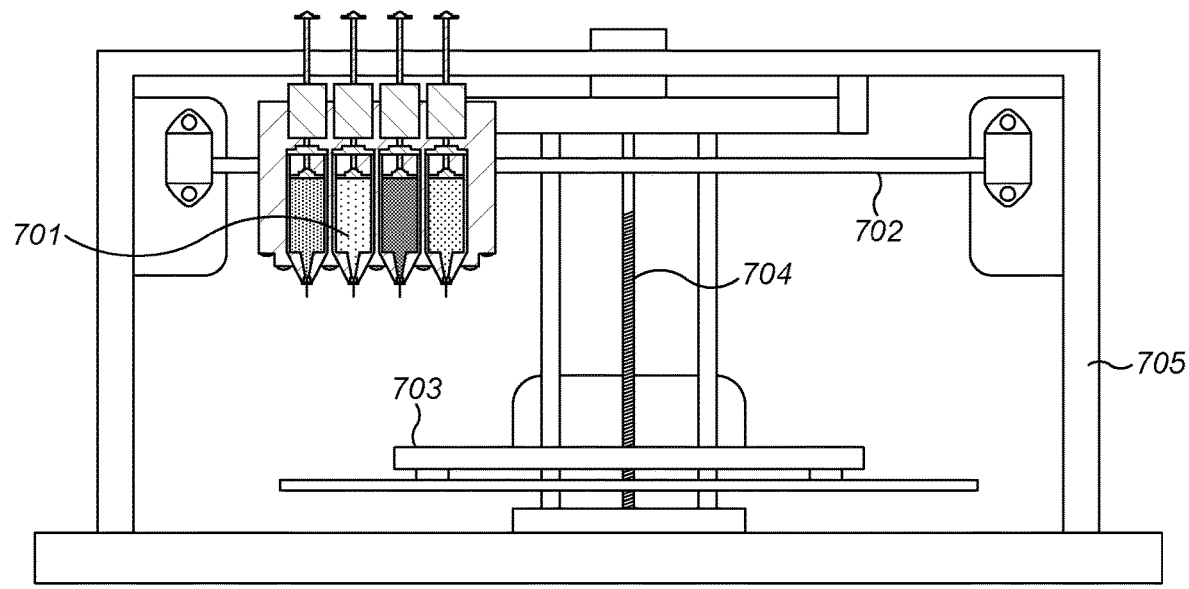
FIG. 7 is a schematic representation of the print head of any of the preceding embodiments placed in a standalone rapid fabrication unit.

FIG. 7 is a schematic representation of the apparatus used to fabricate the electronic circuit board and components, using print head embodiments as described in FIGS. 1 to 6. FIG. 7 is an illustration of the apparatus comprising: a print head 701 arrangement that can be configured by any of the print heads disclosed in this specification, a drive mechanism 702 that moves the print head in the X and Y direction, a build platform 703, a drive mechanism 704 that moves the build platform in the Z direction and an environmentally controlled build cabinet 705.

The print head 701 of FIG. 7 is only one of the print head configurations that can be used in this system, and is only shown in the drawing as an illustration. Any of the print heads described in this document may be designed to be interchangeable depending on the item to be made. The print heads that are described herein are parts of embodiments of the invention, but other embodiments do not preclude the inclusion of other print head and material dispensing systems. Other print systems such as aerosol, inkjet and laser cured resin could also be integrated into the fabrication system, in alternative embodiments of the invention. The drive mechanism 702 that moves the print head in the X and Y direction is designed to provide smooth transition from left to right and back and forth.

The build platform 703 is self-levelling, and may be heated or cooled, depending on the conditions required by the materials. The build platform can also vibrate to ensure even distribution of materials, as the material can be agitated into position. The build platform being configured to vibrate also ensures that the materials are deposited in even levels and layers. The drive mechanism 704 that moves the build platform in the Z direction positions the build platform at the correct height during the build process. The environmentally controlled build cabinet 705 ensures that the build environment is clean and climate controlled. In specific cases the cabinet may activate gas removal and air filtration systems so that the build environment is suitable for the specific type of material being deposited and those materials that may be affected by normal atmospheric conditions.

Inline Rapid Fabrication Unit

Figure 8:
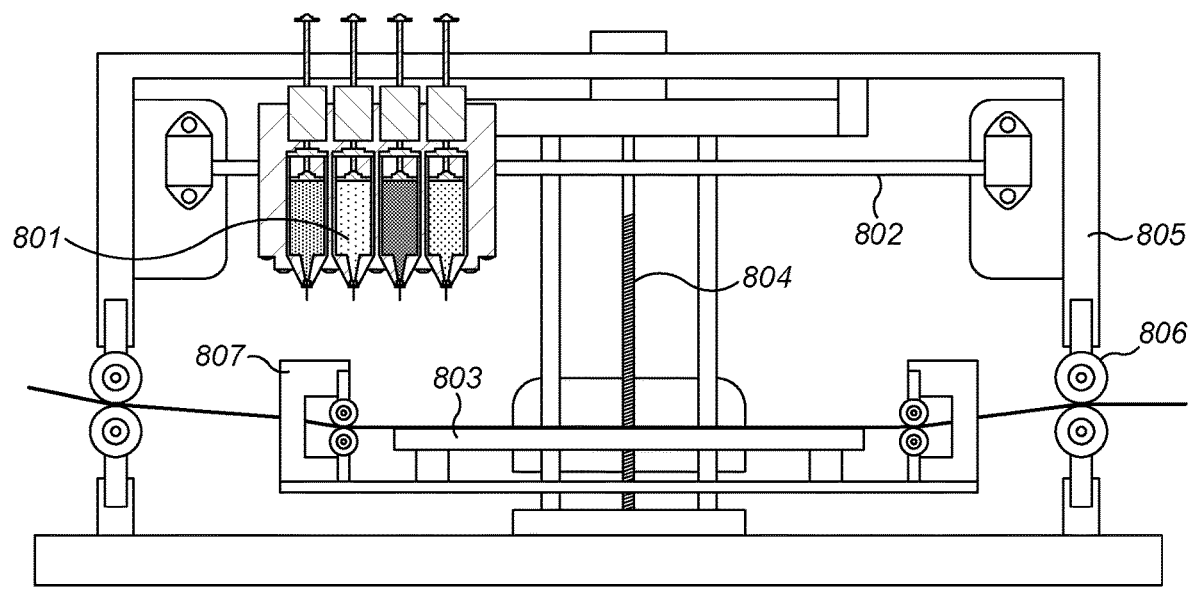
FIG. 8 is a schematic representation of the print head of any of the embodiments of FIGS. 1 to 7, in an inline rapid fabrication unit.

FIG. 8 is a schematic representation of an inline rapid fabrication unit, that uses the print head embodiments as described in FIGS. 1 to 4 to fabricate electronic circuits and components. FIG. 8 is an illustration of the apparatus comprising: a print head 801 arrangement that can be configured by any of the print heads disclosed in FIGS. 1 to 4, a drive mechanism 802 that moves the print head in the X and Y direction, a vacuum build platform 803, a drive mechanism 804 that moves the build platform in the Z direction, an environmentally controlled build cabinet 805, a retractable build substrate tensioning mechanism 806 and a build plate with retractable build substrate tensioning mechanism 808.

The rapid fabrication unit illustrated in FIG. 8 is predominantly the same as the system described in FIG. 7, with the exception that the feed system for the substrate is automatic and specifically suited for the production of flexible printed circuits. The print head 801 is similar to that described in FIGS. 1, 2, 3, and 4. The drive mechanism 802, that moves the print head in the X and Y direction, is as described in FIG. 7. The vacuum build platform 803 is designed to hold the substrate flat and in position as the material is deposited. The vacuum build platform may vibrate to ensure the even distribution of the deposited materials.

The drive mechanism 804 which moves the build platform in the Z direction is as described in FIG. 7. The environmentally controlled build cabinet 805 is as described in FIG. 7. The retractable build substrate tensioning mechanism 806 moves the substrate in and out of the fabrication environment. The rollers may retract to enable tall components that have been fabricated on the printer circuit to pass through without damage. The build plate retractable build substrate tensioning mechanism 807 provides tension to the substrate before the vacuum is activated. This ensures the flexible substrate is flat.

Inline Rapid Fabrication Unit (Extruding, Milling and Multi-Angle Build Plate)

Figure 9:
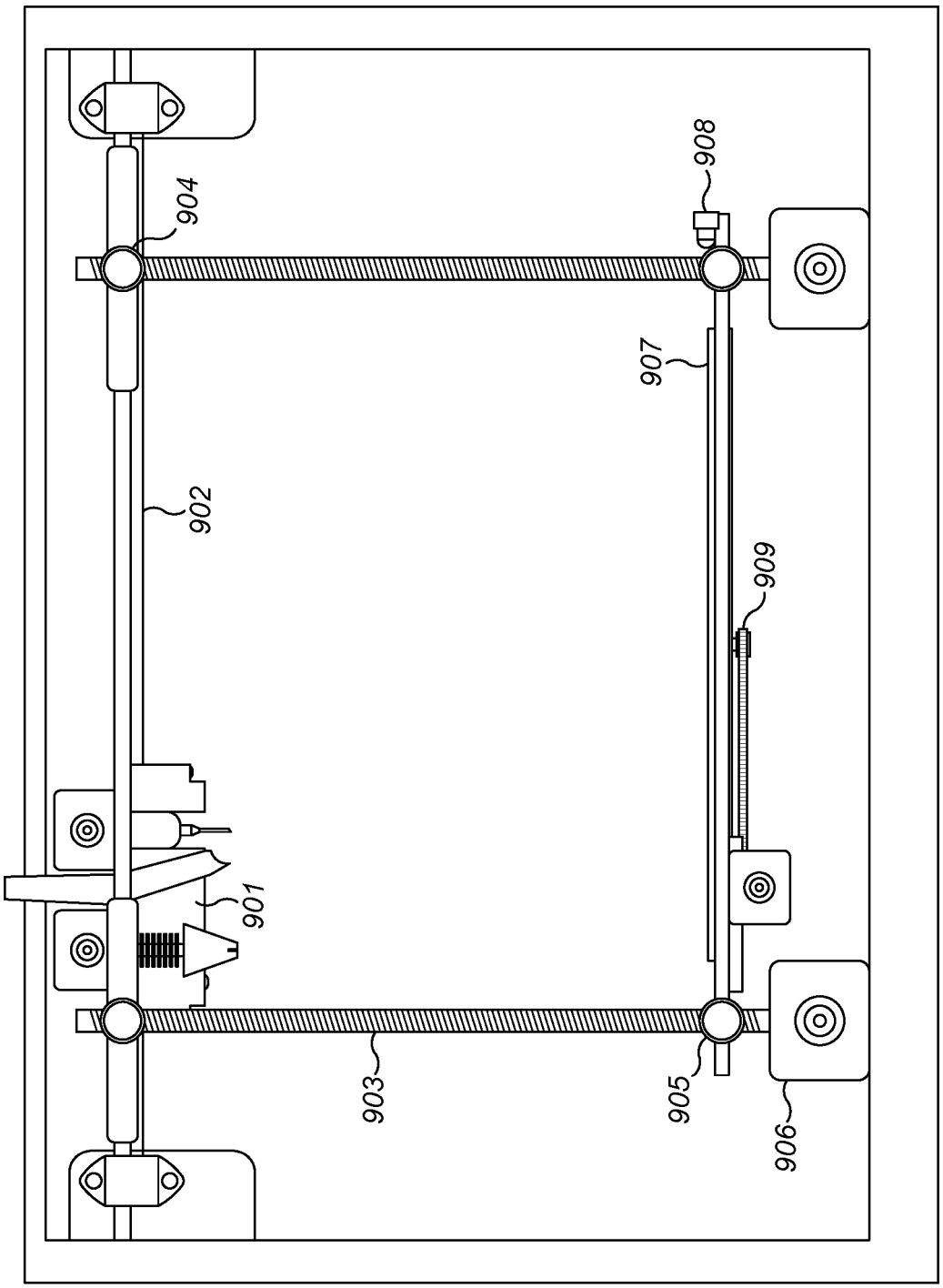
FIG. 9 is a schematic representation of an inline rapid fabrication unit that includes elements for extruding and/or milling and having a multi-angled build plate.

FIG. 9 is a schematic representation of a further embodiment of the inline rapid fabrication unit described in FIG. 8, wherein the print head apparatus is configured as in FIGS. 1 to 6. The inline rapid fabrication unit as illustrated in FIG. 9 comprises: a print head 901 as in the embodiments described in FIGS. 1 to 6, a drive mechanism 902 that moves the print head in the X and Y direction, a vertical drive mechanism 903 that control the height of each corner of the build platform and thereby may control the angle of the build platform, a vertical drive mechanism 904, a joint 905 that enables the build platform to be raised at an angle, vertical drive mechanism motors 906, a revolving build platform 907, a sensor that detects the position of the revolving platform 908 and a drive mechanism 909 for the revolving platform.

The inline rapid fabrication unit uses a print head as described in any of FIGS. 1, 2, 3, 4, 5 and 6 which may be interchangeable, where the print head selection will depend on the component to be fabricated. The drive mechanism that moves the print head in the X and Y direction is as described in FIGS. 7 and 8. The build platform 907 is a revolving platform that is controlled by a drive system 909, with the height and the angle of the build platform also being controlled in 3-dimensional space by the four drive units 906.

Rapid Fabrication of Multi-Layer Printed Circuit Boards and Electronic Components FIGS. 10 to 18 illustrate the processes undertaken by the previous embodiments to create a multi-layered electronic circuit board and components.

The print head apparatus of the previous embodiments enables the fabrication of multi-layered electronic circuit boards and components by adding layers of materials, deposited via the nozzle arrangement of the print heads discussed, to a substrate and sequentially depositing and curing the desired material to build up the desired electronic circuitry. Components can be fabricated by controlled deposition of material, in specific areas and configurations, upon the substrate or previously deposited layers. For example, in the case of printing a capacitor, the electronic circuit would have already been printed using the fabrication methods described in this application. In the location where the capacitor would be required, the contact and first plate would be printed, utilising the print layering method described in FIGS. 10 to 18, then the dielectric would be printed over the top of this layer, thus enclosing the first plate. The second plate would then be printed over the previously printed capacitor layers, thus connecting the second plate to the other portions of the capacitor and the correct connection point on the electronic circuitry.

Figure 10:
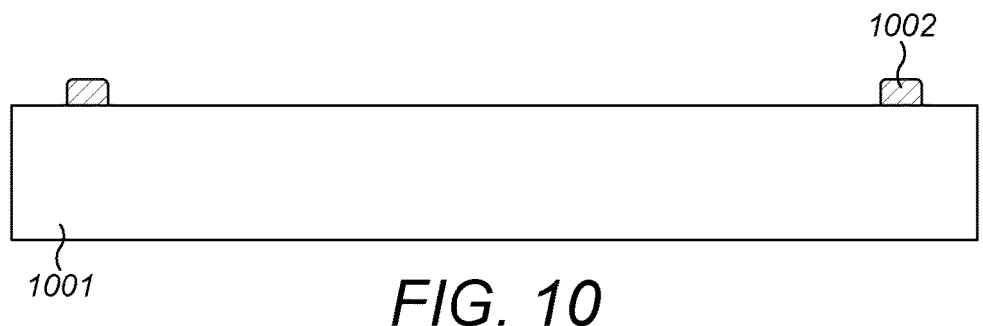
FIGS. 10 to 18 are schematic representations to illustrate the steps and processes undertaken in fabricating the electronic circuits and/or components.

FIG. 10 represents the initial stage in the process of fabricating the circuit and components. FIG. 10 represents the stage where the build platform or substrate 1001 has had a support material 1002 deposited upon the surface, this material being deposited using the print head apparatus as described in the previous embodiments.

The support materials can be any material used in the fabrication of the electronic circuit and component. They are printed with the purpose of supporting or holding up a structure or layer before the curing process. The support material only remains in place while the specific layer or component requires support, after which time the support material is removed and discarded. In the case of a layer or component overhanging the substrate, the support material is printed from the same material as that of the layer or component that overhangs.

Figure 11:
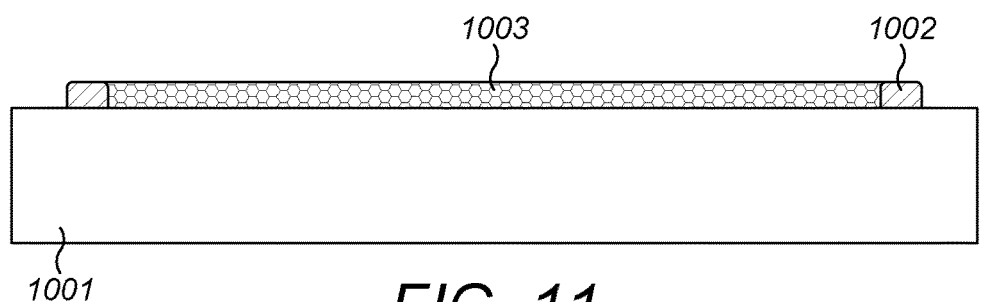

FIG. 11 illustrates the next step in the process of fabricating the electronic circuit board and components, wherein the first layer of the printed circuit board 1003 is deposited upon the build platform, this layer also being deposited using the previously described print head embodiments.

Figure 12:
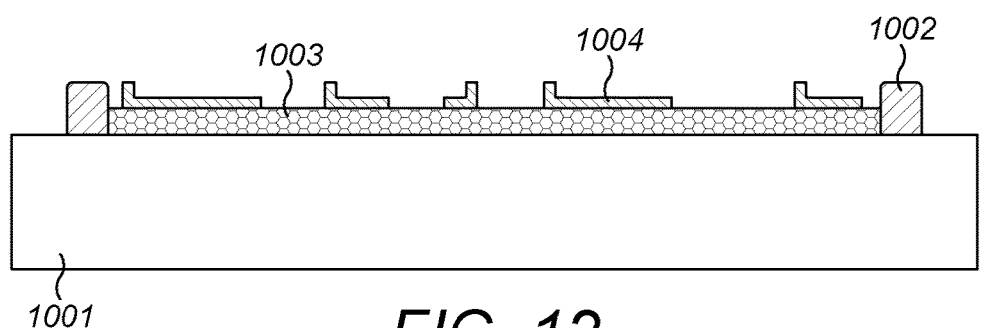

FIG. 12 shows the stage where materials representing the conductive sections of the first layer of the circuit board and the connections that will connect the next layer 1004 are printed onto the preceding layers using any of the print head embodiments described in the specification.

Figure 13:
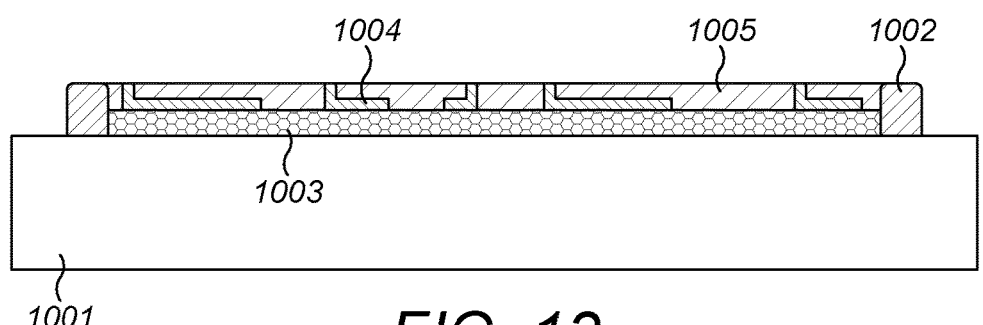

FIG. 13 is a schematic illustration of the next stage in the fabrication process. FIG. 13 represents the printing of the second layer of material 1005 being printed onto and over the substrate 1001 and first layer 1003.

Figure 14:
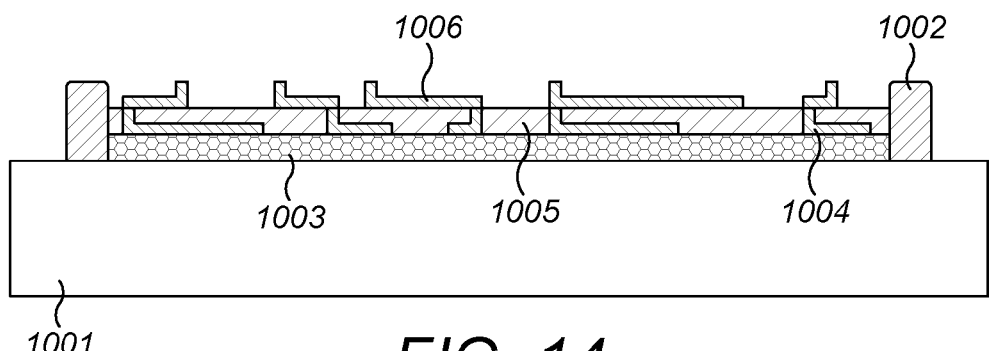

FIG. 14 is a schematic representation of the next stage in the process of fabrication of an electronic circuit board and component. FIG. 14 is a representation building on the embodiment of FIG. 13, where the conductive sections of the second layer 1005 of the multi-layered circuit board and the connections that will connect to the next layer 1006 are printed onto the surface of the build platform 1.

Figure 15:
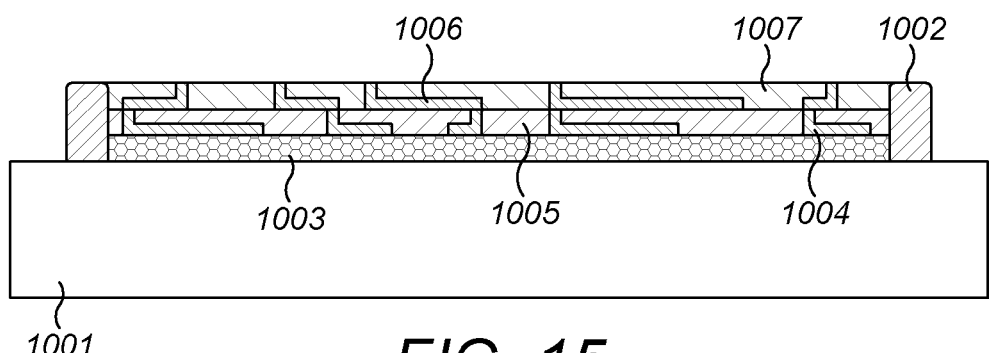

FIG. 15 is a schematic representation of the next stage in the process of fabricating the electronic circuit board and component. FIG. 15 is an illustrative representation indicating the printing of a third layer 1007 onto the preceding first and second layers 1003, 1005.

Figure 16:
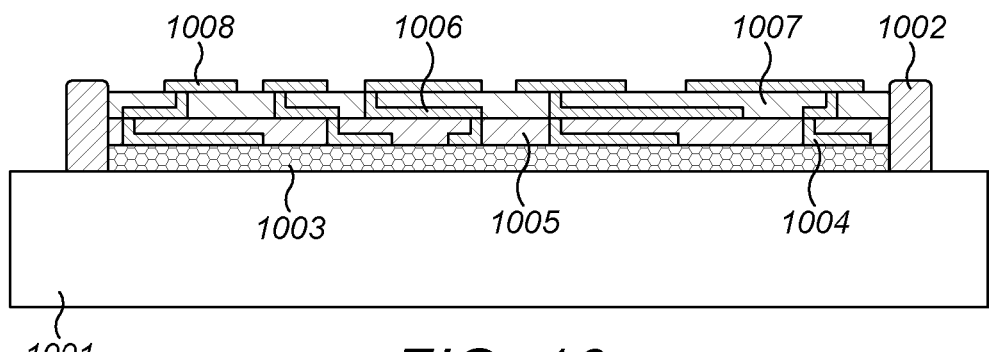

FIG. 16 is a schematic representation of the next stage in the process of fabricating an electronic circuit board and component. FIG. 16 illustrates the depositing of the conductive sections of the third layer of the multi-layered circuit board and the connections that will connect the next layer 1008.

Figure 17:
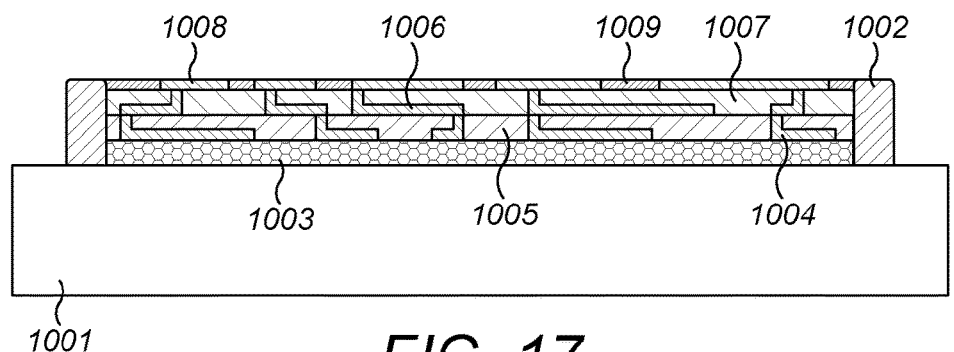

FIG. 17 is a schematic representation of the next stage in fabricating an electronic circuit board and component. FIG. 17 illustrates the printing of a fourth layer 1009 onto the previous layers as described in the FIGS. 10 to 16.

Figure 18:
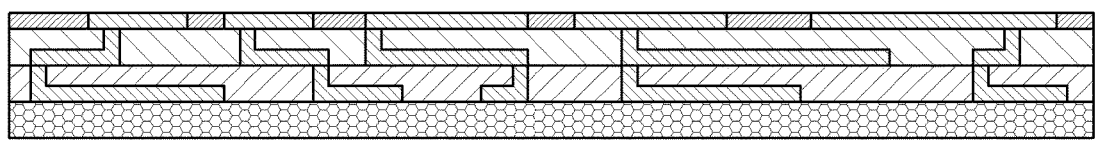

FIG. 18 is a schematic representation of the finished electronic circuit board and components.

Figure 19:
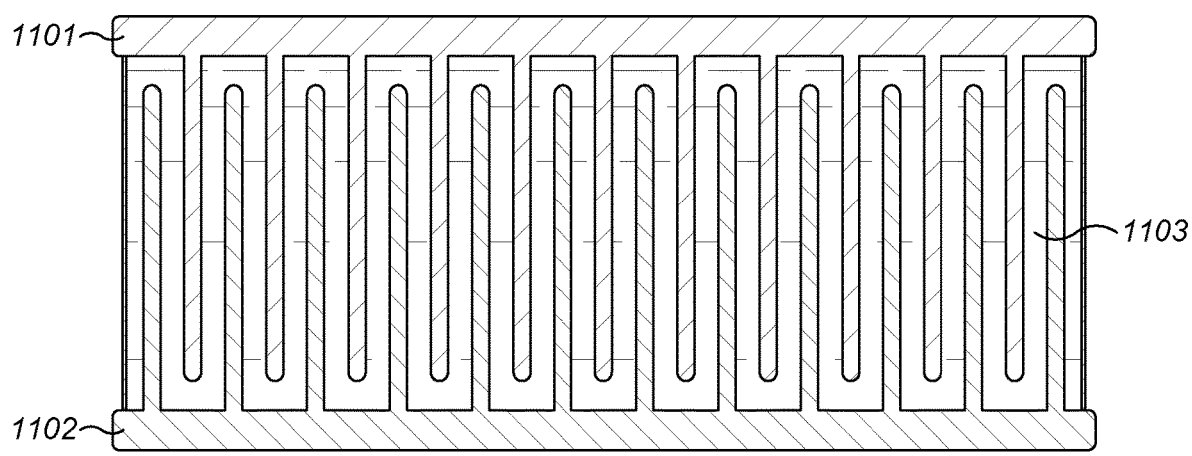
FIG. 19 is a schematic representation of an electronic component containing a liquid construction element created using the rapid fabrication apparatus.
Figure 20:
FIGS. 20 to 40 are schematic representations of the steps and fabrication processes undertaken, by means of the preceding embodiments, to fabricate a 3-dimensional structure.
Figure 21:
Figure 22:
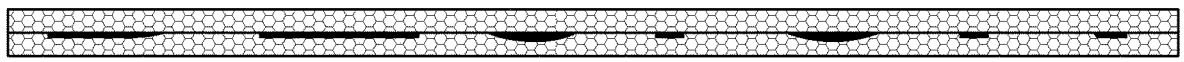
Figure 23:
Figure 24:
Figure 25:
Figure 26:
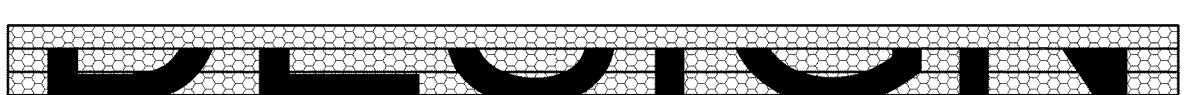
Figure 27:
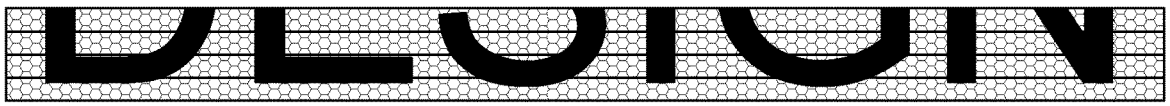
Figure 28:
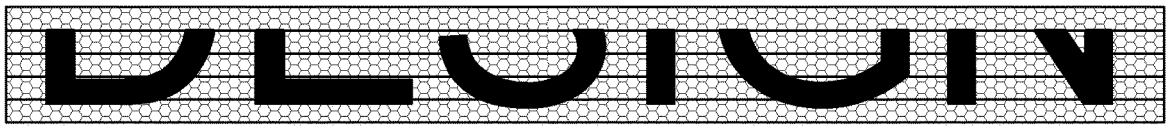
Figure 29:
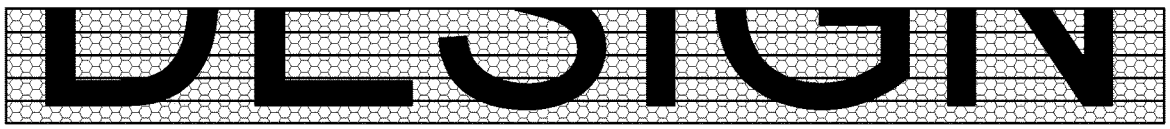
Figure 30:
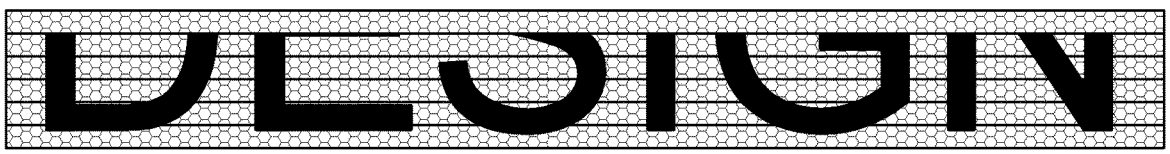
Figure 31:
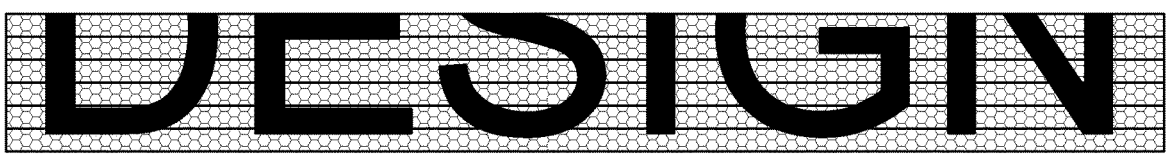
Figure 32:
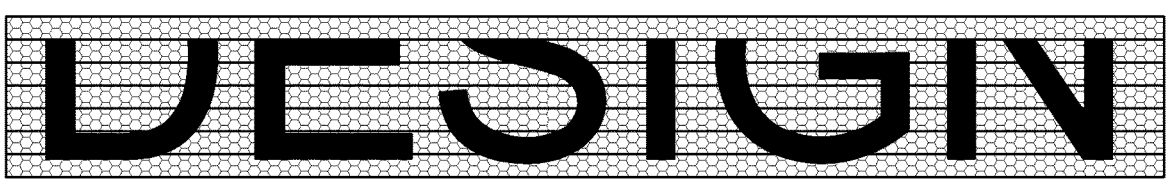
Figure 33:
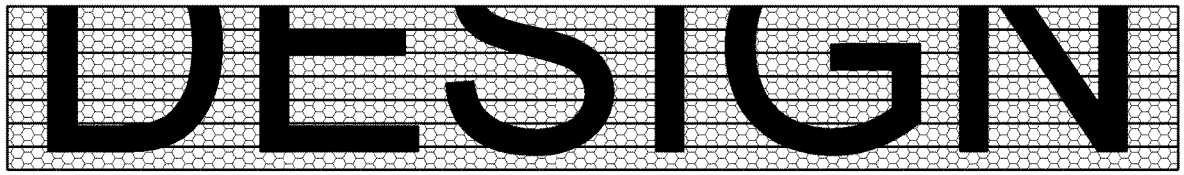
Figure 34:
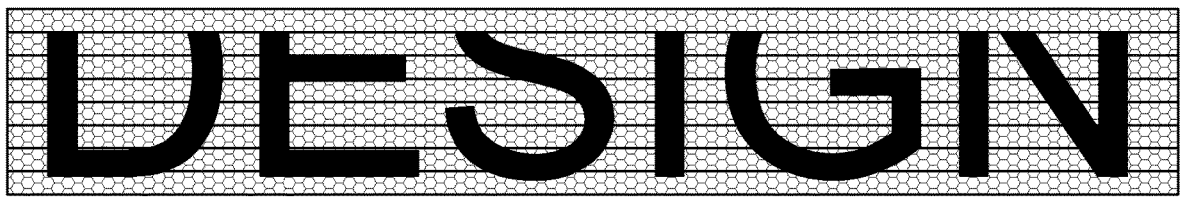
Figure 35:
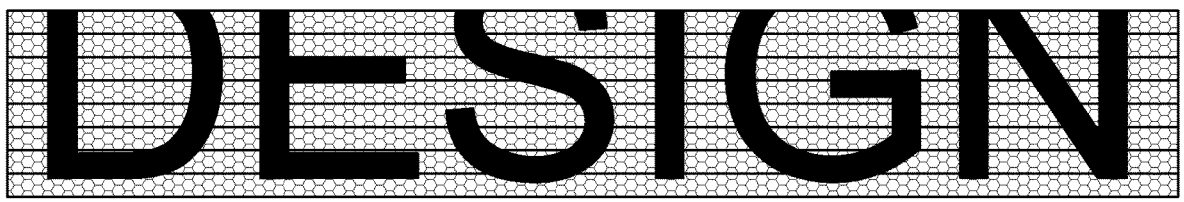
Figure 36:
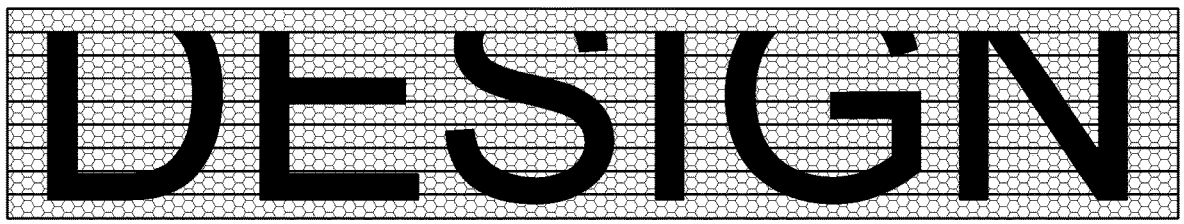
Figure 37:
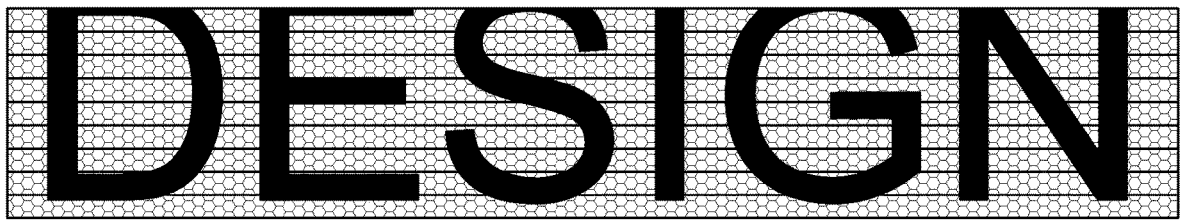
Figure 38:
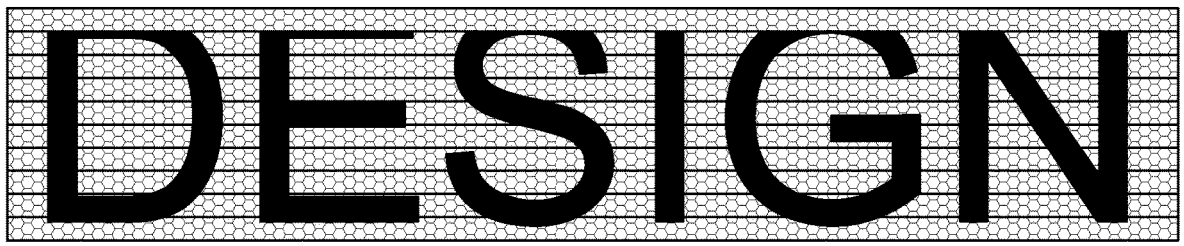
Figure 39:
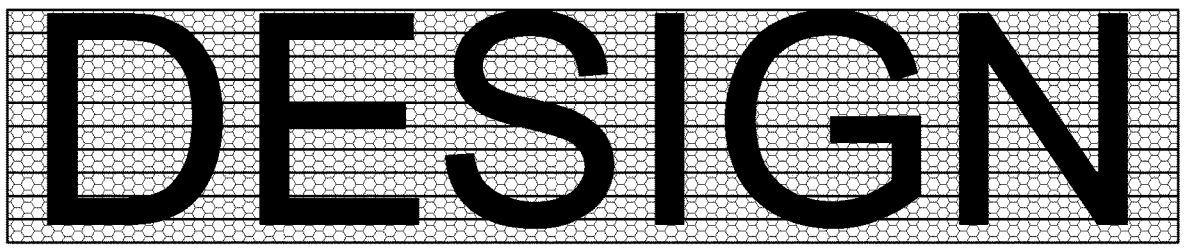
Figure 40:
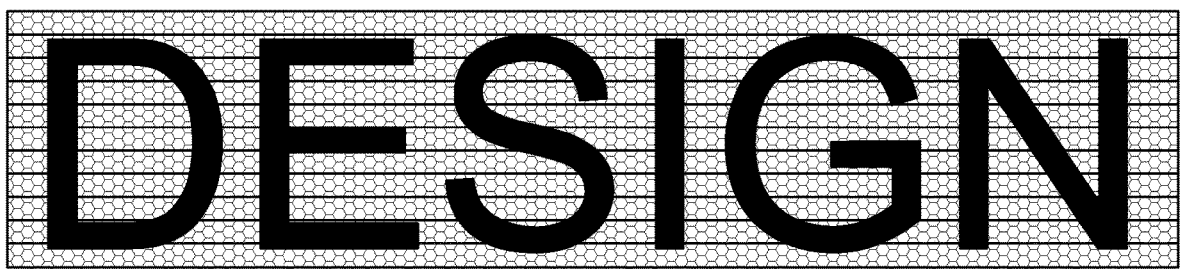

Rapid Fabrication of an Electronic Component Containing a Liquid Construction Element FIG. 19 represents a schematic representation of an electronic component fabricated using the print head and processes of any of the previous embodiments, the component comprising a negatively doped material 1101, a positively doped material 1102 and a liquid, gel, powder or solid material 1103 that may be a dielectric, electrolyte, coolant and/or magnetic material or other such material known in the art.

FIG. 19 describes a method of constructing a device such as a battery, capacitor or other such devices by constructing the negatively charged sections 1101 of the device with material using the printing methods as described in FIGS. 1 to 17, and positively charged sections 1102 of the device with material using the printing methods as described in FIGS. 1 to 17, and then the dispensing of material 1103, which could take the form of a liquid, gel, powder or solid and can be dispensed in the constructed container before it is then sealed by the methods described in FIGS. 1 to 18.

The component is printed by a method as described by the previous embodiments, yet leaving a hole and cavities for the material 1103 to occupy. The material 1103 is then injected, by a dispensing nozzle as described in the previous embodiments, through the hole left by the incomplete fabrication process. Once this has been undertaken the component is subjected to the final fabrication of a layer of material printed over the hole. Once this has been completed the component is cured, sealing the dielectric or electrolyte material 1103 in the component. If the material 1103 is a functional part of the electronic circuit, the material 1103 may electrically contact the remaining portions of the electronic circuit.

The ability to add liquids, gels, powders and solid dielectric or electrolyte materials 1103, as functional elements, of a component fabricated by the methods described in the previous embodiments, is advantageous because components that require liquids for their electrical function can be fabricated without the need for additional fabrication or manufacturing processing steps. There may also be provided a dispenser for laying into the cavities a metal or composite wire, for the creation of electrical function within the liquids, gels, powders, solids and so on.

High Energy Photonic Curing

The curing system described above may comprise a photonic curing system, such as a high energy broad spectrum curing system. The system may produce rapid pulses of high energy to cure materials without affecting the underlying substrate, which may be thermally sensitive. Such high energy pulses can improve conductivity of electric circuits and densify inorganic materials into working electronic components such as varistors, transistors or other such components known to the art. This energy may be spread over a wide area or highly focused.

Colour Change 3D Printing

The stages as illustrated in FIGS. 20 to 40 describe the processes undertaken to fabricate 3-dimensional structures that can have their colour changed as they are fabricated. The material is printed in layers, as in the layering process as described in FIGS. 10 to 18, with each material being printed as a single base colour with a colour change material mixed into it. This base colour is printed onto the substrate and cured with an energy source, which is used to activate the colour change material within the base colour material. The energy source can be directed to specific areas of the substrate, so as to change the colour of specific areas. As the intensity and duration of the exposure to the energy source increase, the more the colour change material is activated and with this the colour changes from magenta, to cyan, to yellow to black. The layering of a specific material and then subsequently changing of its colour enables multicolour and full colour prototypes, that more closely match the computer model designs, to be made. This process can also incorporate the use of many type of material that can be flexible, and perform electronic functions. Using the printing process described in this document, many composites of material can be constructed, and affected to change their colour and function.

This technique allows for many types of material and components to be developed which can be printed as a single colour but then can have the colour automatically changed, as needed, during the fabrication process. The colour change material may be colourless or one single colour that when subjected to radiation of a specific type, changes to another colour. A plurality of different binary colour change materials may be laid down together and then colour-changed to produce many colour effects.

The invention claimed is:

1. A circuit board and component fabrication apparatus, comprising:
    a print head configured to deposit at least first and second different materials on a substrate so as to print electronic circuit boards and/or components, wherein the print head comprises at least first and second material dispensing nozzles grouped together so as to dispense respectively said first and second different materials at or near the same location, so as to combine said first and second different materials as said first and second different materials are dispensed to create a mixture or reaction of the first and second different materials.

2. The apparatus of claim 1, wherein the print head comprises:
- an X, Y drive system for driving the print head relative to the substrate; and
- a dispenser for dispensing the first and second different materials.

3. The apparatus of claim 2, wherein the dispenser comprises at least:
- a pressure cylinder;
- a pressure control unit and drive;
- a pressure extension arm; and
- a pressure extension arm stop and empty sensor.

4. The apparatus of claim 1, wherein the print head further comprises a curing energy source to cure the material deposited on the substrate.

5. The apparatus of claim 4, wherein the print head comprises at least one additional curing energy source.

6. The apparatus of claim 4, wherein the at least one energy source comprises one or more of an infra-red, ultra violet or other frequency light emitting diode, a directed heating element, a radio frequency sonic directed frequency or a high energy broad spectrum curing system.

7. The apparatus of claim 1, wherein the height of at least one of the material dispensing nozzles is adjustable.

8. The apparatus of claim 1, wherein at least one of the material dispensing nozzles comprises a material extruder nozzle.

9. The apparatus of claim 8, wherein the material extruder nozzle is variable in size.

10. The apparatus of claim 8, wherein the material extruder nozzle further comprises a heating element to heat the material.

11. The apparatus of claim 8, wherein the print head further comprises a material feed sensor for sensing movement of material through the material extruder nozzle.

12. The apparatus of claim 8, wherein the print head further comprises a material pressure sensor to measure the pressure associated with moving the material through the material extruder nozzle.

13. The apparatus of claim 1, including a sensor for sensing the height of the one or more materials and/or the substrate.

14. The apparatus of claim 1, wherein the nozzles are each directed towards said location.

15. The apparatus of claim 1, arranged to control the clearance of the nozzles relative to the substrate.

* * * * *